(12) United States Patent
Abdo et al.

(10) Patent No.: US 10,768,521 B2
(45) Date of Patent: Sep. 8, 2020

(54) EXTREME ULTRAVIOLET (EUV) MASK ABSORBER AND METHOD FOR FORMING THE SAME

(71) Applicant: GLOBALFOUNDRIES INC., Grand Cayman (KY)

(72) Inventors: Amr Y. Abdo, Beacon, NY (US); Lei Zhuang, Ridgefield, CT (US); Jed H. Rankin, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 98 days.

(21) Appl. No.: 15/876,540

(22) Filed: Jan. 22, 2018

(65) Prior Publication Data
US 2019/0227427 A1    Jul. 25, 2019

(51) Int. Cl.
*G03F 1/24*    (2012.01)
*G03F 1/58*    (2012.01)
*G03F 1/38*    (2012.01)

(52) U.S. Cl.
CPC .............. *G03F 1/24* (2013.01); *G03F 1/38* (2013.01); *G03F 1/58* (2013.01)

(58) Field of Classification Search
CPC ................ G03F 1/54; G03F 1/58; G03F 1/24
See application file for complete search history.

(56) References Cited

U.S. PATENT DOCUMENTS 6,479,195 B1    11/2002   Kirchauer et al.
9,436,078 B2    9/2016    Sun et al.
2013/0029253 A1    1/2013    Mangat et al.
2015/0064611 A1    3/2015    Shih et al.
2015/0104731 A1*   4/2015    Yu .............................. G03F 1/22
                                                                       430/5
2016/0223896 A1    8/2016    Sun et al.

OTHER PUBLICATIONS

Jan Pomplun et al., "Rigorous FEM-Simulation of EUV-Masks: Influence of Shape and Material Parameters," Society of Photo-Optical Instrumentation Engineers, SPIE 6349, 63493D (2006), 26th Annual BACUS Symposium on Photomask Technology, P.M. Martin, R.J. Naber, Eds., 8 pages.

* cited by examiner

*Primary Examiner* — Daborah Chacko-Davis
(74) *Attorney, Agent, or Firm* — Anthony Canale; Hoffman Warnick LLC

(57) ABSTRACT

An extreme ultraviolet (EUV) mask including an absorber structure is disclosed. The absorber structure may include at least one slanted and/or concave sidewall. The absorber structure may include a sidewall including a step. A method of forming an absorber for an EUV mask is disclosed. The method may include etching an absorber layer using a mask to form an absorber structure having a sidewall wherein an outer edge of the top surface of the sidewall is closer to a central vertical axis of the absorber structure than an outer edge of the bottom surface of the sidewall. The method may include performing additional etching steps to form a step along the sidewall of the absorber structure. The etching may include combinations of anisotropic etching in different directions, and/or isotropic etching. The method may include etching an absorber layer including multiple absorber layers having different material properties on the ML reflector.

9 Claims, 7 Drawing Sheets

US 10,768,521 B2

EXTREME ULTRAVIOLET (EUV) MASK ABSORBER AND METHOD FOR FORMING THE SAME

BACKGROUND

The present disclosure relates to semiconductor device fabrication, and more specifically, to extreme ultraviolet (EUV) masks including absorbers having various sidewall configurations.

In conventional fabrication of semiconductor devices, semiconductor wafers are processed in batches including a large number of integrated circuit (IC) structures on a single wafer. As semiconductor fabrication progresses, it becomes more desirable to increase the number of structures and decrease the size of the structures formed on the single wafer. As a result, the critical dimensions of on the wafer are further reduced as well. In order to satisfy the increasingly constricting critical dimension requirements, extreme ultraviolet (EUV) lithography techniques are used.

Extreme ultraviolet (EUV) lithography enables the fabrication of semiconductor devices having critical dimensions less than 28 nanometers (nm) in width. In contrast to conventional lithography techniques, EUV lithography utilizes extreme ultraviolet (EUV) light to transfer a circuit reflective portions of an EUV photomask (referred to herein as an "EUV mask") to a semiconductor die. In one common implementation, the EUV mask includes a substrate, a multi-layer (ML) reflector formed over the substrate, and an absorber layer formed over the ML reflector. The ML reflector is designed to reflect EUV light at a chosen EUV wavelength (e.g., 13.5 nanometers). The absorber layer is designed to absorb EUV at the same chosen EUV wavelength. Utilizing conventional lithography, the absorber layer is patterned to expose selected areas of the underlying ML reflector corresponding to a desired circuit layout. The remaining portions of the absorber layer (referred to herein as "absorber structures") absorb EUV light that is not desired to be reflected to wafer.

During EUV lithography, EUV light is projected through a system of mirrors onto the EUV mask at a slight angle relative to the mask surface (commonly referred to as an "angle of incidence"). The EUV light impinging the absorber structures is absorbed; while the light impinging upon the exposed regions of the ML reflector is reflected from the EUV mask onto a layer of photoresist, which is then used to transfer a desired circuit layout to a semiconductor die. Due to the angle of incidence of the EUV light used during EUV lithography, a shadowing effect occurs where portions of the incoming and outgoing EUV light are blocked by the upper sidewall portions of the absorber structures. The shadowing effect may skew the critical dimensions of the structures being patterned on the semiconductor die. Conventional solutions for minimizing the shadowing effect include reducing the thickness or height of the absorber structures. One problem associated with this solution is that reducing the thickness or height of the absorber structures also reduces the absorptivity of the absorber material.

SUMMMARY

A first aspect of the disclosure includes a method for forming an extreme ultraviolet (EUV) mask, the method including: forming an absorber layer on a multi-layer (ML) reflector; and etching the absorber layer to form at least one absorber structure including: a bottom surface of the absorber structure contacting a top surface of the ML reflector, a top surface of the absorber structure opposite the bottom surface, and a sidewall of the absorber structure extending between the bottom surface and the top surface, wherein an outer edge of the top surface of the absorber structure is closer to a vertical axis passing through a central point of the bottom surface of the absorber structure than an outer edge of the bottom surface.

A second aspect of the disclosure is directed to a method for forming an extreme ultraviolet (EUV) mask, the method including: forming a first absorber layer on a multi-layer (ML) reflector above a substrate; forming a second absorber layer on the first absorber layer; and etching the first absorber layer and the second absorber layer, to form an absorber structure wherein after the etching, the second absorber layer covers less than an entire top surface of the first absorber layer.

A third aspect of the disclosure is related to an extreme ultraviolet (EUV) mask including: a multi-layer (ML) reflector positioned on a substrate; and an absorber structure positioned on a portion of the ML reflector, the absorber structure including: a bottom surface of the absorber structure contacting a top surface of the ML reflector in the absorber region, a top surface of the absorber structure opposite the bottom surface, and a sidewall of the absorber structure extending between the bottom surface of the absorber structure and the top surface of the absorber structure, wherein an outer edge of the top surface is closer to a vertical axis passing through a central point of the bottom surface of the absorber structure than an outer edge of the bottom surface.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide absorber structures for an extreme ultraviolet (EUV) mask including sidewall portions having different angular orientations and/or shapes. Embodiments of the present disclosure may also provide methods for forming the same. Methods according to the disclosure may include forming one or more absorber layers on a multilayer (ML) reflector, and etching the absorber layer(s) by utilizing: (i) one or more types of directional etching, and/or (ii) absorber materials with different types of etch selectivity. Embodiments of the disclosure may, for example, prevent and/or mitigate the shadowing effect caused by conventional sidewall portions of absorber structures of EUV masks. For example, embodiments of the disclosure may prevent and/or mitigate the EUV light reflecting off of the ML reflector from contacting a sidewall portion of a nearby absorber structure.

Turning to the drawings, FIGS. 1-9 show forming absorber structures for an EUV mask from a single absorber layer, according to embodiments of the disclosure. FIGS. 10-14 show forming absorber structures for an EUV mask from multiple absorber layers, according to embodiments of the disclosure.

Figure 1:
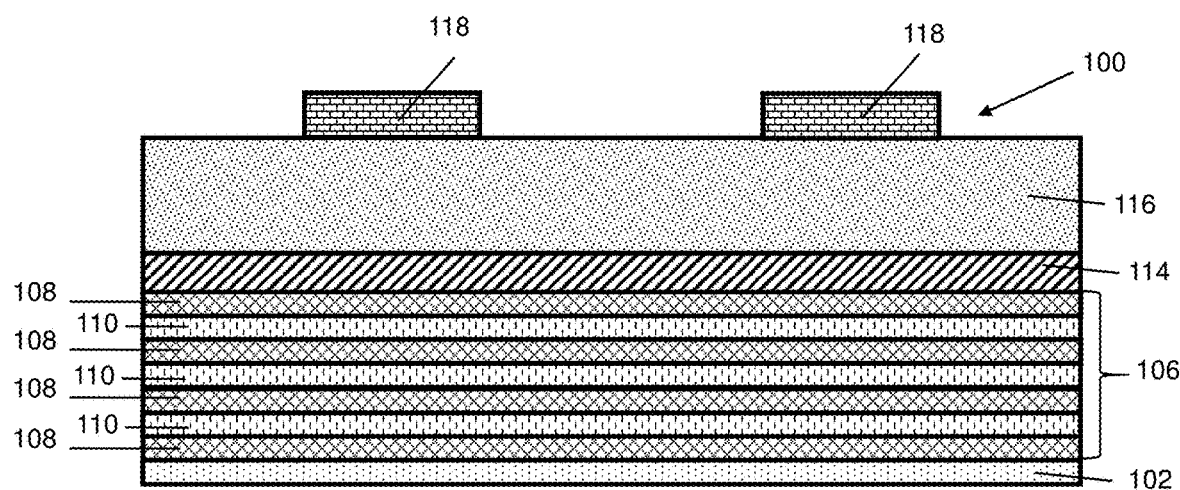
FIG. 1 shows a cross-sectional view of an initial structure for forming absorber structures, according to the prior art.

FIG. 1 shows an initial structure 100 for forming absorber structures for an extreme ultraviolet (EUV) mask, according to embodiments of the disclosure. FIG. 1 shows a cross-sectional view of initial structure 100. As shown in FIG. 1, initial structure 100 may include a substrate 102 upon which the remainder of the initial structure may be formed. Substrate 102 may be formed using any now known or later developed semiconductor fabrication techniques for forming a substrate for an EUV mask. Substrate 102 may include any now known or later developed material for an EUV mask substrate. For example, substrate 102 may include a material having a relatively low coefficient of thermal expansion. In a non-limiting example, substrate 102 may include synthetic quarts.

As also shown in FIG. 1, initial structure 100 may include a multilayer (ML) reflector 106 positioned on the top surface of substrate 102. ML reflector 106 may be formed to reflect EUV light for transferring a pattern to a semiconductor die opposite the EUV mask. ML reflector 106 may include any number of layers formed from any material or group of materials, currently known or later developed, for an EUV mask ML reflector. For example, ML reflector 106 may include materials suitable for substantially reflecting incident EUV light at a selected wavelength (e.g., 13.5 nanometers). In the non-limiting example of FIG. 1, ML reflector 106 may include seven (7) layers of alternating molybdenum layers 108 and silicon layers 110. In additional non-limiting examples not shown, ML reflector 106 may include any combination of molybdenum, beryllium, ruthenium, silicon, etc. Although ML reflector 106 is shown to include seven (7) layers, it is understood that this number is merely exemplary and ML reflector 106 may include any desirable number of layers for an ML reflector. The layers of ML reflector 106 (e.g., molybdenum layers 108, and silicon layers 110) may be formed by deposition and/or any other now known or later developed semiconductor fabrication techniques for forming layers of an ML reflector. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As also shown in FIG. 1, initial structure 100 may include a capping layer 114 positioned on ML reflector 106. Capping layer 114 may protect ML reflector 106 from being removed, etched, altered, etc., during the patterning of an absorber layer 116 formed thereabove. Capping layer 114 may include ruthenium (Ru) and/or any other now known or later developed capping layer material. Capping layer 114 may be formed by conventional semiconductor fabrication techniques for forming a capping layer. In a non-limiting example, capping layer 114 may be formed by deposition. Capping layer may be approximately 2 to approximately 4 nanometers in thickness.

Although not shown in the figures, a backside film may be optionally formed on substrate 102 opposite ML reflector 106. The backside film may include, for example, a chromium nitride film and/or any other now known or later developed backside films. The backside film may be formed by conventional semiconductor fabrication techniques for forming a backside film such as, for example, deposition.

As shown in FIG. 1, initial structure 100 may further include an absorber layer 116 positioned on capping layer 114. Absorber layer 116 may be subsequently patterned to re-expose portions of ML reflector 106, and to form absorber structures for an EUV mask. Absorber layer 116 may include any material or group of materials, now known or later developed for forming an absorber structure therefrom. For example, absorber layer 116 may include any material suitable for substantially absorbing incident EUV light at a selected wavelength (e.g., 13.5 nanometers). In the non-limiting example of FIG. 1, absorber layer 116 may include a tantalum-containing material such as tantalum boron nitride (TaBN), tantalum boron oxide (TaBO), tantalum nitride (TaN), tantalum oxide (TaO), etc. In other non-limiting examples, absorber layer 116 may include any combination of Nickel (Ni), nickel oxide (NiO), Ruthenium (Ru), or other alloys, or multilayer stacks. Although absorber layer 116 is shown as including one layer in the example of FIG. 1, it is understood and will be discussed further herein with respect to FIGS. 10-14 that this is merely illustrative, and absorber layer 116 may include any desirable number of layers of any combination of absorber structure materials. Absorber layer 116 may be formed by conventional semiconductor fabrication techniques for forming an absorber layer. In a non-limiting example, absorber layer 116 may be formed by deposition.

As shown in FIG. 1, initial structure 100 may also include a mask 118 positioned on absorber layer 116. Mask 118 may be patterned to protect portions of absorber layer 116 thereunder for forming absorber structures for an EUV mask. Mask 118 may include, for example, an organic planarization layer (OPL), and/or any other now known or later developed material for a mask. In another non-limiting example, not shown, mask 118 may include multiple layers such as a photoresist layer, an OPL, and/or an anti-reflective coating (ARC) layer. Mask 118 may be formed by conventional semiconductor fabrication techniques for forming a mask. In a non-limiting example, mask 118 may be formed by deposition, patterning, developing and etching.

Figure 2:
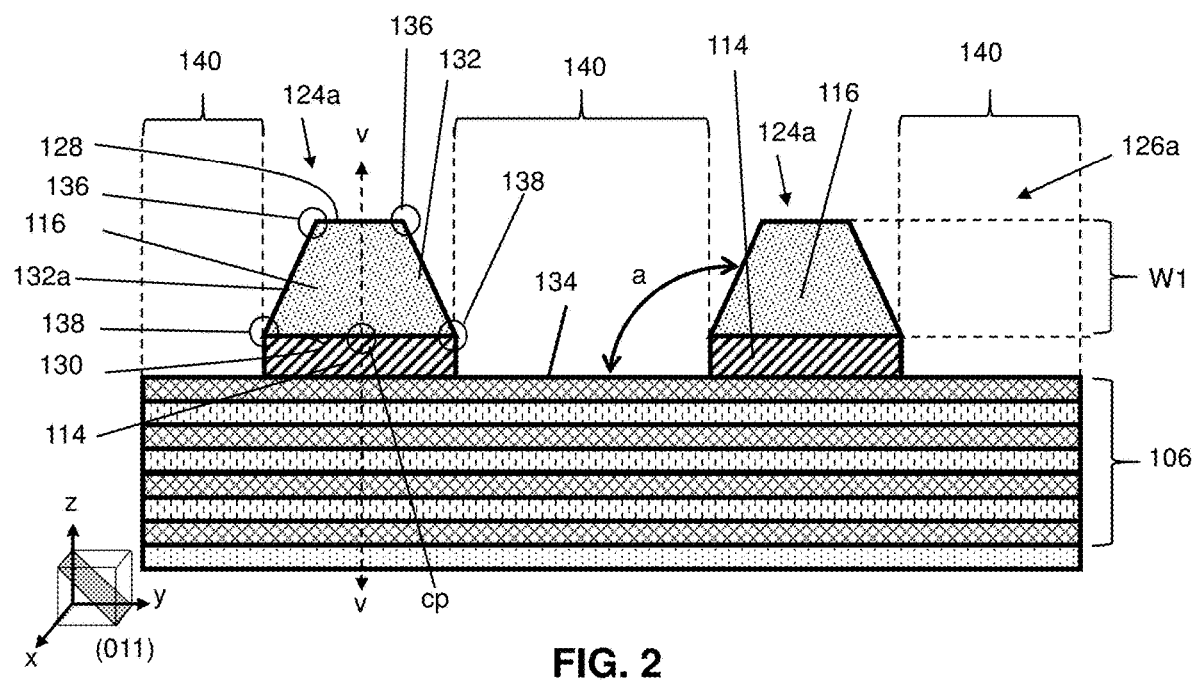
FIG. 2 shows a cross-sectional view of forming absorber structures for an extreme ultraviolet (EUV) mask from the initial structure of FIG. 1, according to embodiments of the disclosure.
Figure 3:
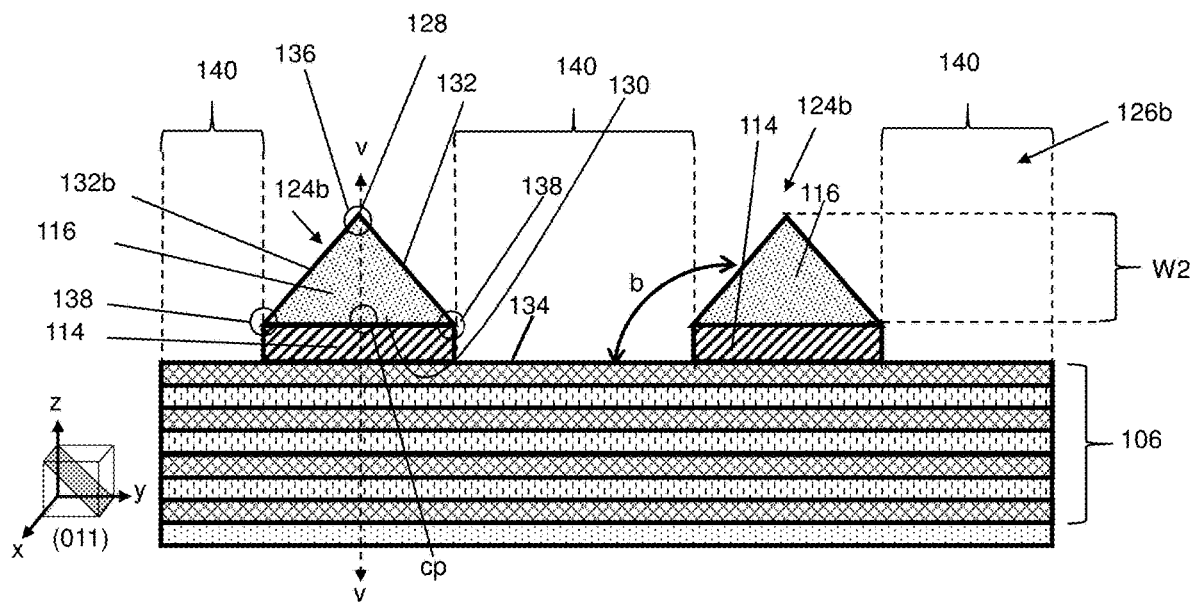
FIG. 3 shows a cross-sectional view of another example of forming absorber structures for an EUV mask from the initial structure of FIG. 1, according to embodiments of the disclosure.
Figure 4:
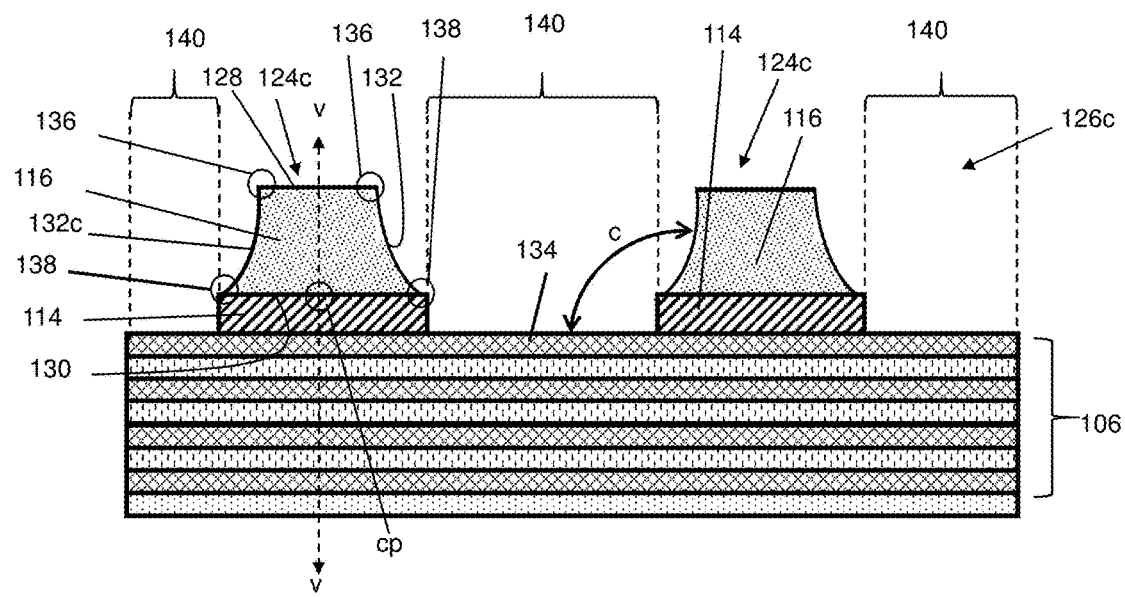
FIG. 4 shows a cross-sectional view of yet another example of forming absorber structures for an EUV mask from the initial structure of FIG. 1, according to embodiments of the disclosure.

Turning now to FIGS. 2-4, EUV masks 126a-c including absorber structures 124a-c, respectively, formed from initial structure 100 (FIG. 1) are shown, according to embodiments of the disclosure. As shown in FIGS. 2-4, portions of absorber layer 116 and capping layer 114 may be removed to form absorber structures 124a (FIG. 2), 124b (FIG. 3), and 124c (FIG. 4) positioned on remaining portions of the capping layer. For example, removing portions of absorber layer 116 and capping layer 114 may expose portions of top surface 134 of ML reflector 106, creating reflective portions 140 and absorber structures 124a-c of the EUV mask.

As also shown in FIGS. 2-4, each absorber structure (e.g., 124a-c) may include a top surface 128, a bottom surface 130, and sidewalls portions (e.g., portions 132a-c) extending between top surface 128 and bottom surface 130. In contrast to conventional absorber structures, sidewall portions 132a-c of the absorber structures described herein may be formed with a variety of angular orientations and shapes by utilizing different types of etching processes and absorber layer materials. Additionally, absorber structures 124a-c (FIGS. 2-4) described herein may also be formed to include a variety of cross-sectional geometries, by utilizing different types of etch processes and absorber layer materials. As will be discussed herein, absorber structures 124a-c (FIGS. 2-4) may prevent and/or mitigate the shadowing effect caused by conventional EUV masks absorber structures.

Referring now to FIGS. 2 and 3 together, examples of absorber structures 124a, 124b, including substantially straight and slanted sidewall portions 132a,b, are shown. Absorber structures 124a and 124b having substantially straight and slanted sidewall portions 132a,b may be formed, for example, by anisotropic etching of absorber layer 116 (FIG. 1) in the (011) crystalline direction of the absorber material as indicated by the grid in the figure. There are multiple orientation planes in the material that can be used. The planes are defined in the x-y-x plane by the "Miller Indices" methodology. Common orientations classified by the "Miller indices" are (100), (011), (001), (010) and (111). As used herein, "etching in a crystalline direction" may include etching primarily on the surface of the material specified by the crystalline direction/plane. As used herein, "anisotropic etching" may include an etching process having an etch rate dependent on the crystallographic orientation of the material being etched. Etching generally refers to the removal of material from a substrate (or structures formed on the substrate), and is often performed with a mask in place so that material may selectively be removed from certain areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Capping layer 114 may be removed be conventional methods such as etching in the (001) crystalline direction.

As also shown in FIGS. 2 and 3, sidewall portions 132a,b of absorber structures 124a,b, respectively, may have different angular displacements with respect to a top surface 134 of ML reflector 106. For example, in FIG. 2, absorber structures 124a may include sidewall 132a at an angular displacement 'a' of approximately 93 degrees to approximately 110 degrees from top surface 134 of ML reflector 106. In the example of FIG. 3, absorber structures 124b may include sidewalls 132b at an angular displacement 'b' of approximately 93 degrees to approximately 110 from top surface 134 of ML reclector 106. Angular displacements 'a' and 'b' may be varied, for example, by selecting materials with different crystallographic orientations. For example, in the example of FIG. 3, the material of absorber layer 116 may include TaBNO while the material of absorber layer 116 in FIG. 2 may include TaBN. Angular displacements 'a' and 'b' may include any desirable angle for preventing EUV light from contacting sidewall portions 132a,b of the absorber structures after reflecting off of top surface 134 of ML reflector 106. For example, angular displacements 'a' and 'b' of sidewall portions 132a,b, respectively, from top surface 134 of ML reflector 106 may be selected based on the angle of incidence with respect to the ML reflector 106 of the EUV light directed at the EUV mask.

FIGS. 2 and 3, also show examples of absorber structures 124a, 124b having different cross-sectional geometries. In the example of FIG. 2, absorber structures 124a may include a substantially trapezoidal cross-sectional geometry. In the example of FIG. 3, absorber structures 124b may include a substantially triangular cross-sectional geometry. The cross-sectional geometry of absorber structures 124a, 124b may be varied, for example, by varying the width of absorber layer 116. For example, absorber layer 116 may include a smaller width W1 for forming the cross-sectional geometry of absorber structures 124a of FIG. 2, whereas absorber layer 116 may include a larger width W2 for forming the cross-sectional geometry of absorber structures 124b of FIG. 3. Width W1 and width W2 of absorber layer 116 in the example of FIGS. 2 and 3, respectively may include values between approximately 50 nanometer (nm) to approximately 200 nm.

Referring next to FIG. 4, absorber structures 124c including substantially concave sidewall portions 132c for EUV mask 126c are shown. Substantially concave sidewall portions 132c may be formed, for example, by isotropic (i.e., directionless) etching of absorber layer 116 (FIG. 1). As used herein, "isotropic etch" may refer to an etching process having an etch rate that is equivalent in all etch directions, i.e., independent of direction or "directionless." As discussed above with respect to absorber structures 124a and 124b (FIGS. 2 and 3), although absorber structures 124c are shown as including a substantially trapezoidal cross-sectional geometry, the cross-sectional geometry may be varied. Additionally, although absorber structures 124c are shown as including sidewall portions 132c at an angular displacement 'c' from top surface 134 of ML reflector 106, it is understood that angular displacement 'c' and the cross-sectional geometry may also be varied.

Figure 5:
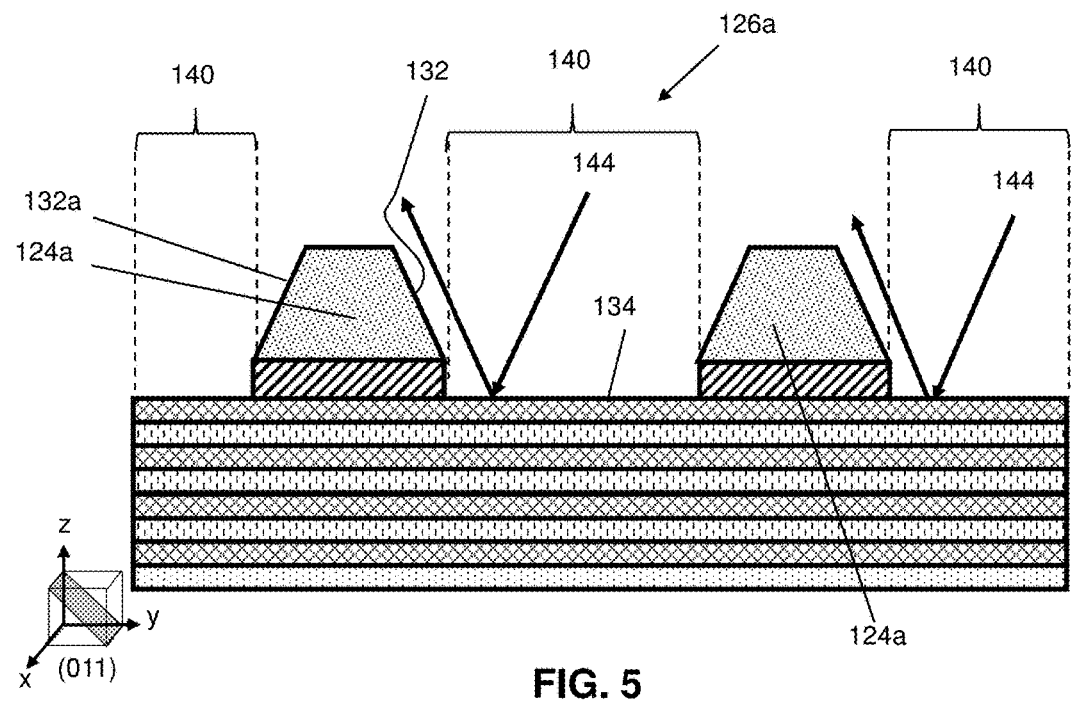
FIG. 5 shows a cross-sectional view of exposing the EUV mask of FIG. 2 to EUV light, according to embodiments of the disclosure.

Absorber structures 124a, 124b, 124c (FIGS. 2-4) formed according to embodiments of the disclosure may prevent and/or mitigate the shadowing effect caused by the sidewall portions of conventional EUV mask absorber structures. For example, each absorber structure 124a-c may include an outer edge 136 of the top surface that is positioned laterally closer to a vertical axis 'v,' passing through a substantially central point 'cp' of bottom surfaces 130 of the absorber structure, than an outer edge 138 of the lower surface of the absorber structure. As shown in FIG. 5, absorber structures 124a may therefore allow the EUV light 144 reflecting off of reflective regions 140 (i.e., top surface 134 of ML reflector 106) of EUV mask 126a to pass by the absorber structures without contacting sidewall portions 132a. Although absorber structures 124a are shown in FIG. 5, it should be understood that any absorber structures 124b-c (FIGS. 3-4) may similarly prevent and/or mitigate the shadow caused by conventional absorber structures as described above.

Figure 7:
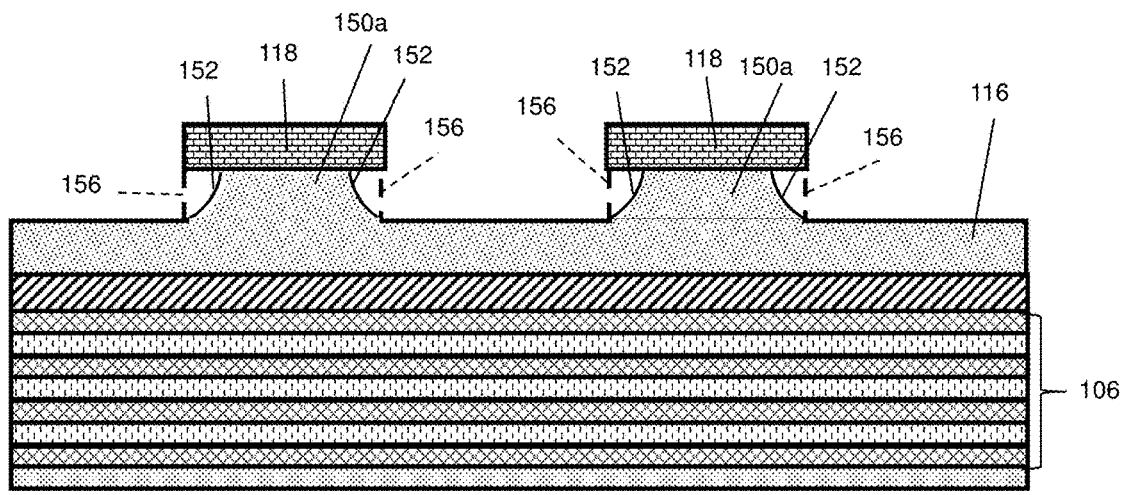
Figure 8:
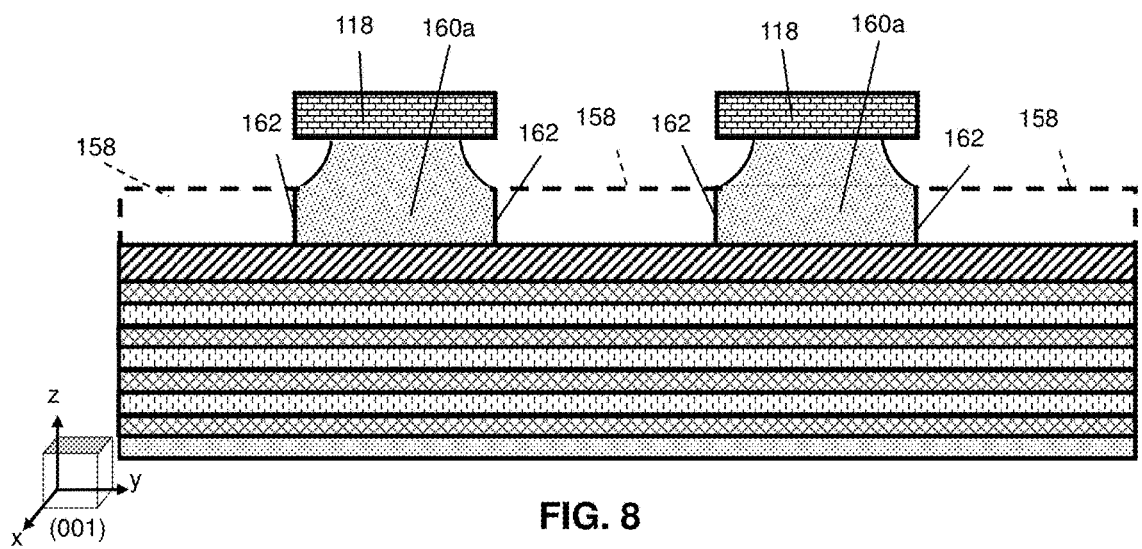
Figure 9:
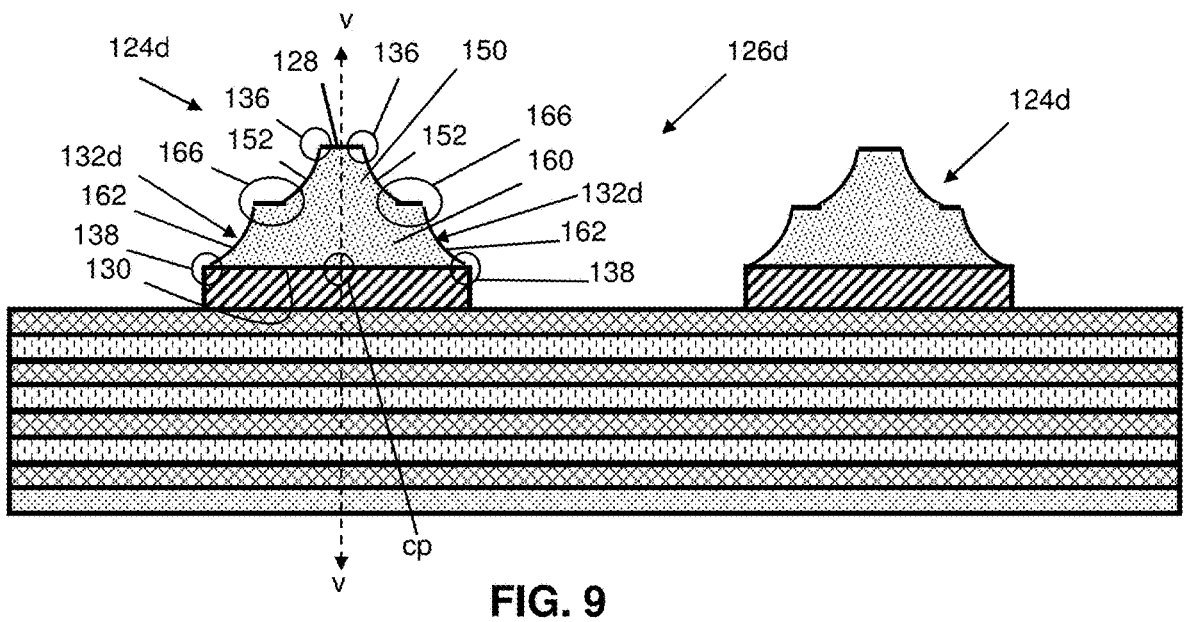

Turning now FIGS. 6-9, another example of forming absorber structures for an EUV mask from initial structure 100 of FIG. 1, according to embodiments of the disclosure is shown. In contrast to the examples of FIGS. 2-5, FIGS. 6-9 show forming absorber structures 124d (FIG. 9) where sidewall portions 132d (FIG. 9) include at least one step 166a (FIG. 9). As will be discussed further herein, forming sidewall portions 132d (FIG. 9) to include step 166a (FIG. 9) may include utilizing multiple etching steps in different directions. As used herein the term "step" may include a structure having a first layer with a length longer than the length of a second layer thereon. Specifically, a step may include a ledge or an offset extending between two different level surfaces. For example, a step may include a structure similar to a step of a stairway.

Figure 6:
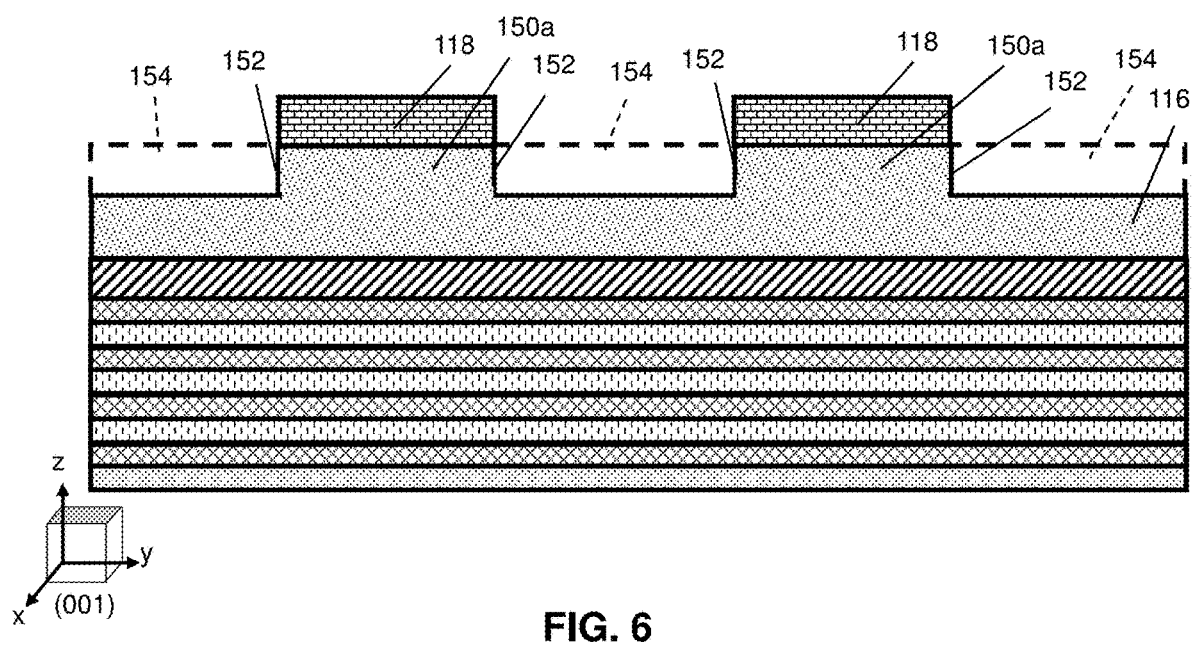
FIG. 6-9 show another example of forming absorber structures for an EUV mask from the initial structure of FIG. 1, according to embodiments of the disclosure.

Referring now to FIG. 6, performing a first etching process on absorber layer 116 using mask 118 is shown, according to embodiments of the disclosures. As shown in FIG. 6, the first etching process may remove first portions 154 (in phantom) of absorber layer 116 (FIG. 1). Portions 154 (in phantom) may be removed to form a top portion 150a of absorber structures 124d (FIG. 9). As shown in the example, of FIG. 6, top portions 150a may be formed using mask 118 and an anisotropic etch primarily in the (001) crystalline direction of absorber layer 116. For example, sidewalls 152 of top portions 150a may be substantially vertical with respect to the top surface of absorber layer 116 (FIG. 1), and substantially vertically aligned with the edges of mask 118.

Referring next to FIG. 7, performing a second etching process on absorber layer 116 (FIG. 1), i.e., top portions 150a, is shown, according to embodiments of the disclosure. As shown in the example of FIG. 7, the second etching process may remove portions 156 (in phantom) of top portions 150a below outer edges of mask 118. Removing portions 156 (in phantom) may allow for subsequent processing of the remainder of absorber layer 116 to form step 166a (FIG. 9). The second etching process may include an isotropic etch. For example, after the second etching process sidewalls 152 of top portions 150a may become concave. Although not shown, portions 156 (in phantom) may alternatively be removed by anisotropic etching primarily in the (010) crystalline direction of absorber layer 116 which may result in sidewalls 152 remaining substantially vertical. In yet another non-limiting example not shown, portions 156 (in phantom) may by removed by anisotropic etching primarily in the (011) crystalline direction of absorber layer 116 which may result in sidewalls 152 being substantially straight and slanted with respect to top surface 134 of ML reflector 106.

Referring next to FIG. 8, performing an etching process on the remainder of absorber layer 116 (FIG. 1) using mask 118 is shown, according to embodiments of the disclosure. For example, portions 158 (in phantom) of the remaining portion of absorber layer 116 (FIG. 1) may be removed to form bottom portions 160a of absorber structures 124d (FIG. 9). As shown in the example of FIG. 8, bottom portions 160a may be formed by anisotropic etching primarily in the (001) crystalline direction of the absorber layer 116. For example, sidewalls 162 of bottom portions 160a may be substantially vertical with respect to the top surface of absorber layer 116 (FIG. 1), and substantially vertically aligned with the edges of mask 118.

Referring next to FIG. 9, performing an additional, optional etch on top portions 150a and bottom portions 160a using mask 118 (FIG. 8) is shown, according to embodiments of the disclosure. The additional etching process may include an isotropic etch to cause sidewalls 162 of bottom portions 160a to be concave. As also shown in FIG. 9, top portions 150a may also be further etched during the optional isotropic etching of bottom portions 160a. Similarly as discussed above with respect to the second etching process of FIG. 7, the additional, optional etch may alternatively include anisotropic etching primarily in the (011) crystalline direction of absorber layer 116.

Removing portions (e.g., portions 158, 156, and 164, in phantom FIGS. 6-8) of absorber layer 116 (FIG. 1) as discussed above with respect to FIGS. 6-8 and optionally FIG. 9 may form absorber structures 124d for EUV mask 126d. Similarly to absorber structures 124a-c of FIGS. 2-4, each absorber structure 124d may include top surface 128, bottom surface 130, and portion 132d extending between top surfaces 128 and bottom surfaces 130. Further, each absorber structure 124d may include an outer edge 136 of the top surface that is positioned laterally closer to a vertical axis 'v,' passing through a substantially central point 'cp' of bottom surfaces 130 of the absorber structure, than an outer edge 138 of the lower surface of the absorber structure. Absorber structures 124d may therefore, similarly to absorber structures 124a-c (FIGS. 2-4), prevent and/or mitigate the shadowing effect caused by conventional absorber structures of EUV mask.

In contrast to absorber structures 124a-c of FIGS. 2-4, sidewall portions 132d of absorber structures 124d may include a step 166a. For example, step 166a may be formed between top surface 128 and bottom surface 130 at the interface between top portion 150a and bottom portion 160a of each absorber structure. Although sidewall portions 132d of absorber structures 124d are shown to include one step 166a, it is understood that sidewall portions 132d may be formed to include any number of steps by further repeating the steps described above with respect to FIGS. 6-9. Additionally, although absorber structures 124d are shown as including top portions 150a as having substantially the same central vertical axis v-v as bottom portions 160a, it should be understood that absorber structures 124d may be formed such that top portions 150a and bottom portions 160a include distinct central vertical axis. Although not shown, it is understood that the processes described with respect to FIGS. 7-9 may be repeated any desirable number of times and modified as necessary to form any desirable number of steps for an absorber structure.

Turning next to FIGS. 10-14, additional examples of forming absorber structures for EUV masks 126e, 126f are shown, according to embodiments of the disclosure. In contrast to the examples of FIGS. 1-9, absorber structures 124e, 124f discussed herein with respect to FIGS. 10-14 may be formed from multiple absorber layers.

Figure 10:
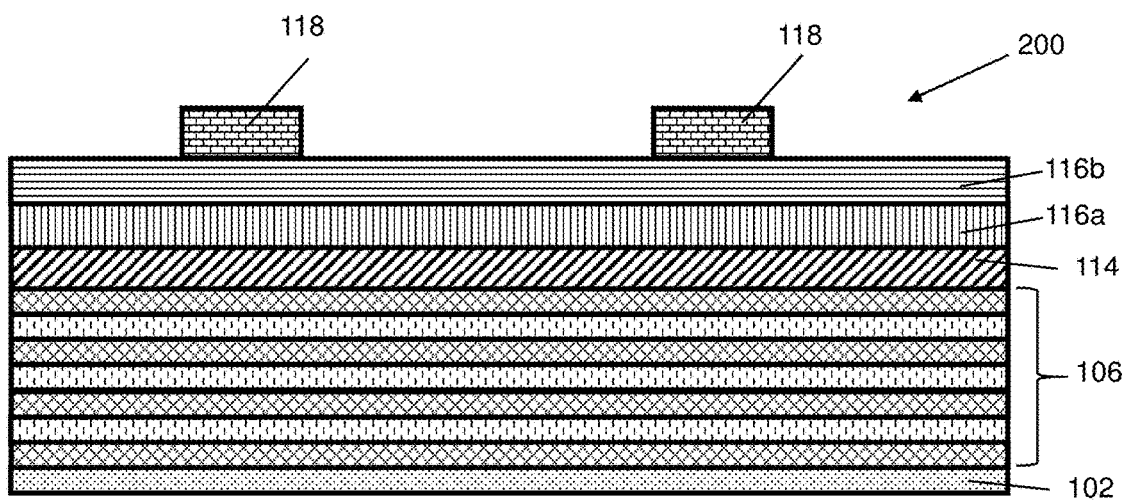
FIG. 10 shows a cross-sectional view of another initial structure for forming absorber structures for an EUV mask, according to embodiments of the disclosure.

Referring now to FIG. 10, an initial structure 200 for forming absorber structures for an EUV mask from multiple absorber layers is shown, according to embodiments of the disclosure. FIG. 10 shows a cross-sectional view of initial structure 200. As shown in FIG. 10, initial structure 200 may include similar substructures as initial structure 100 of FIG. 1 with the exception of the number of absorber layers 116. For example, initial structure 200 may include a substrate 102; a multilayer (ML) reflector 106 positioned on substrate 102; a capping layer 114 positioned on capping layer 11; absorber layers 116a, 116b positioned on capping layer 114; and a mask 118 positioned on the top absorber layer 116b. It should be understood that the structures of initial structure 200 having the same reference numbers as structures described above with respect to initial structure 100 of FIG. 1 may be formed by the same and/or similar methods and materials.

As shown in FIG. 10, in contrast to initial structure 100 of FIG. 1, initial structure 200 may include a first absorber layer 116a positioned on capping layer 114, and a second absorber layer 116b positioned on first absorber layer 116a. In the example of FIG. 10, first absorber layer 116b, and second absorber layer 116b may include different materials. For example, the materials of each absorber layer 116a, 116b may include different etch properties (e.g., crystallographic orientation, general etch selectivity, etc.). Although two absorber layers are shown in the example of FIG. 10, it should be understood that initial structure 200 may include any desirable number of layers for forming an absorber structure.

Figure 11:
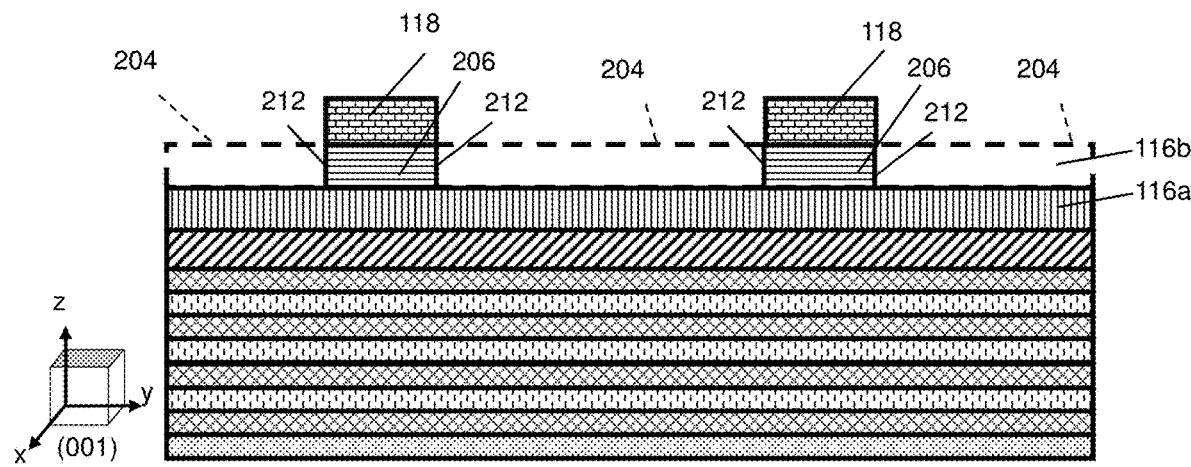
FIGS. 11-13 show forming absorber structures for an EUV mask from the initial structure of FIG. 10, according to embodiments of the disclosure.
Figure 12:
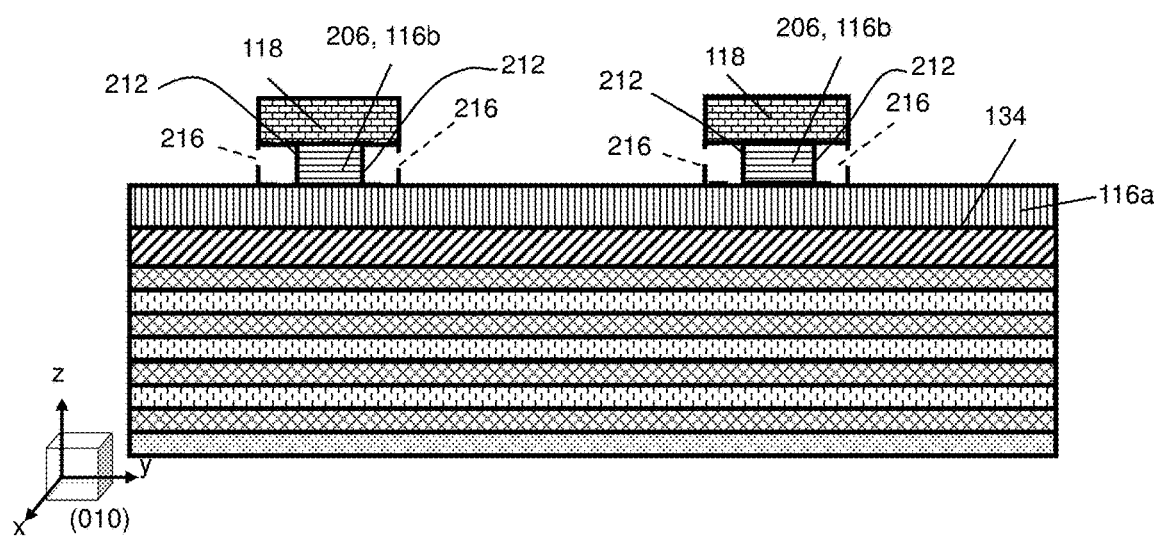
Figure 13:
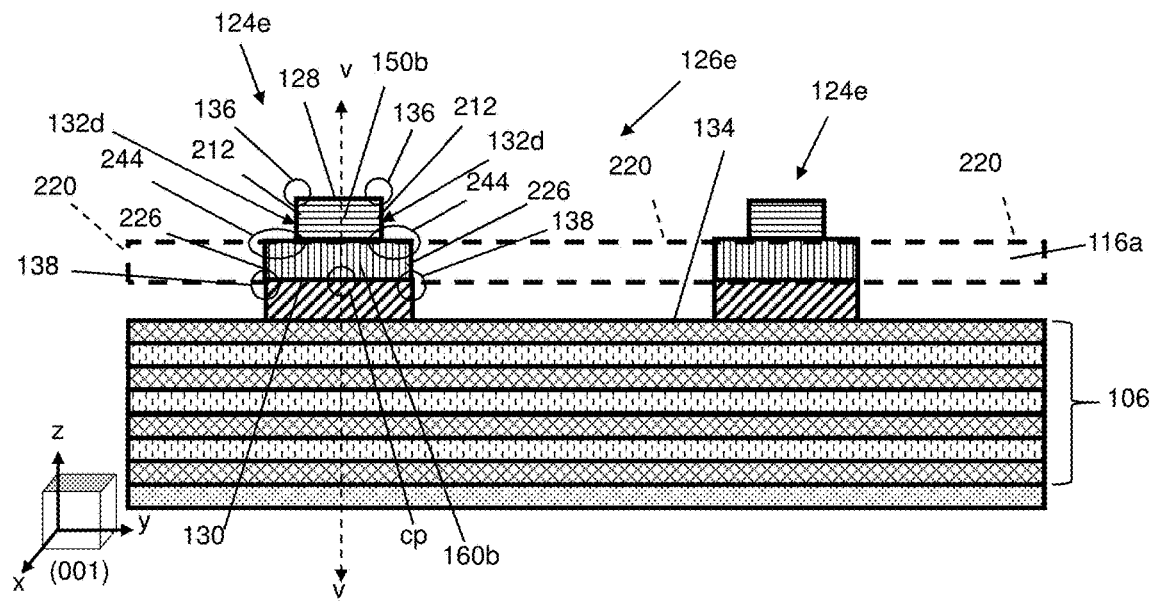

Turning to FIGS. 11-13 together, an example of forming absorber structures 124e from initial structure 200 (FIG. 10), according to embodiments of the disclosure is shown. Forming absorber structures 124e (FIG. 13) may include selecting materials for absorber layers 116a, 116b having different general etch selectivity. For example, in FIGS. 11-13, first absorber layer 116a and second absorber layer 116b may include materials that allow for one layer to remain intact during the etching of the other layer. Additionally, forming absorber structures 124e may include alternating etching processes having different primary etch directions. For example, in FIGS. 11-13, the etching processes may alternate between the (001) crystalline direction, and the (010) crystalline direction of the respective absorber layer.

Referring first to FIG. 11, performing a first etching process to selectively etch second absorber layer 116b using mask 118 is shown, according to embodiments of the disclosure. As shown in FIG. 11, the first etching process may include an anisotropic etch primarily in the (001) direction of second absorber layer 116b to remove first portions 204 (in phantom) thereof. First portions 204 (in phantom) may be removed to form top portions 150b of absorber structures 124e (FIG. 13). Top portions 150b may include sidewalls 212 that are substantially vertical and vertically aligned with the outer edges of mask 118, after the anisotropic etch. As also shown in FIG. 11, the first etching process may be selective to the material of second absorber layer 116b, preventing the material of first absorber layer 116a from being etched, removed, altered, etc., during the first etching process.

Referring next to FIG. 12, performing a second etch to further selectively etch second absorber layer 116b using mask 118 is shown, according to embodiments of the disclosure. As shown in FIG. 12, the second etching process may include an anisotropic etch primarily in the (010) crystalline direction of second absorber layer 116b to remove second portions 216 (in phantom) of top portions 150b. Second portions 216 (in phantom) positioned under the outer edges of mask 118 may be removed from top portions 150b to allow for formation of a step 166b (FIG. 13). As shown in FIG. 12, anisotropically etching top portions 150b primarily in the (010) crystalline direction may result in sidewalls 212 remaining substantially vertical. Although not shown, second portions 216 (in phantom) may alternatively be removed by anisotropic etching primarily in the (011) crystalline direction which may result in sidewalls 212 of top portions 150b being substantially slanted with respect to top surface 134 of ML reflector 106. In yet another non-limiting example not shown, second portions 216 (in phantom) may by removed by an isotropic etch which may result in sidewalls 212 of top portions 150b being concave. As shown in FIG. 12, the second etch may also be selective to the material of second absorber layer 116b, preventing the material of first absorber layer 116a from being etched, removed, altered, etc., during the second etching process.

Turning next to FIG. 13, performing a third etching process to selectively etch first absorber layer 116a is shown, according to embodiments of the disclosure. Etching first absorber layer 116a may form absorber structures 124e for an EUV mask 126e. For example, removing portions 220 (in phantom) of first absorber layer 116a may form bottom portions 160b of absorber structures 124e. Additionally, etching first absorber layer 116a using mask 118 may form steps 166b between top portions 150a and bottom portions 160b. As shown in FIG. 13, the etching process may include an anisotropic etch primarily in the (001) crystalline direction of first absorber layer 116a to remove portions 220 (in phantom) thereof. Anisotropically etching first absorber layer 116a primarily in the (001) crystalline direction may result in sidewalls 226 of bottom portions 160b being substantially vertical and vertically aligned with the outer edges of mask 118. Although not shown, portions 220 (in phantom) may alternatively be removed by anisotropic etching primarily in the (011) crystalline direction of first absorber layer 116a which may result in sidewalls 226 of bottom portions 160b being substantially slanted with respect to top surface 134 of ML reflector 106. In yet another non-limiting example not shown, portions 220 (in phantom) may by removed by an isotropic etch which may result in sidewalls 226 of bottom portions 160b being concave.

As shown in FIG. 13, absorber structures 124e may include top surfaces 128, bottom surfaces 130, and sidewall portions 132e extending between top surfaces 128 and bottom surfaces 130. Similarly to the absorber structures of FIGS. 2-9, absorber structures 124e may have outer edges 136 of the top surface that are positioned laterally closer to vertical axis 'v,' passing through substantially central point 'cp' of bottom surfaces 130 of the absorber structure, than outer edges 138 of the lower surface of the absorber structure. Absorber structures 124e may therefore also similarly prevent and/or mitigate the shadowing effect caused by conventional absorber structures of EUV mask.

Similarly to absorber structures 124d of FIG. 9, absorber structures 124e of FIG. 13 may include top portions 150b and bottom portions 160b. In contrast to the top portions 150a and lower portions 160a of absorber structures 124d (FIG. 9), top portions 150b and bottom portions 160b of absorber structures 120a may include different types of material. Also similarly to absorber structures 124d of FIG. 9, sidewall portions 132e of absorber structures 124e may include a step 166b. For example, step 166b may be formed between top surface 128 and bottom surface 130 at the interface between top portion 150b and bottom portion 160b of each absorber structure. Although sidewall portions 132e are shown in FIG. 13 to include one step 166b, it is understood that sidewall portions 132e of absorber structures 124e may be formed to include any number of steps. For example, additional steps may be formed by forming additional absorber layers of different materials, and further repeating the etching steps described above with respect to FIGS. 10-13. Additionally, although shown in FIGS. 10-13 as including top portions 150b with the same central vertical axis v-v as bottom portions 160b, it should be understood that absorber structures 124e may be formed such that top portions 150b and bottom portions 160b include distinct central vertical axis. Although not shown, it is understood that any number of absorber layers may be formed for initial structure 200 (FIG. 11), and the processes described above with respect to FIGS. 11-13 may be repeated and modified as necessary to form any desirable number of steps and layers for an absorber structure.

Figure 14:
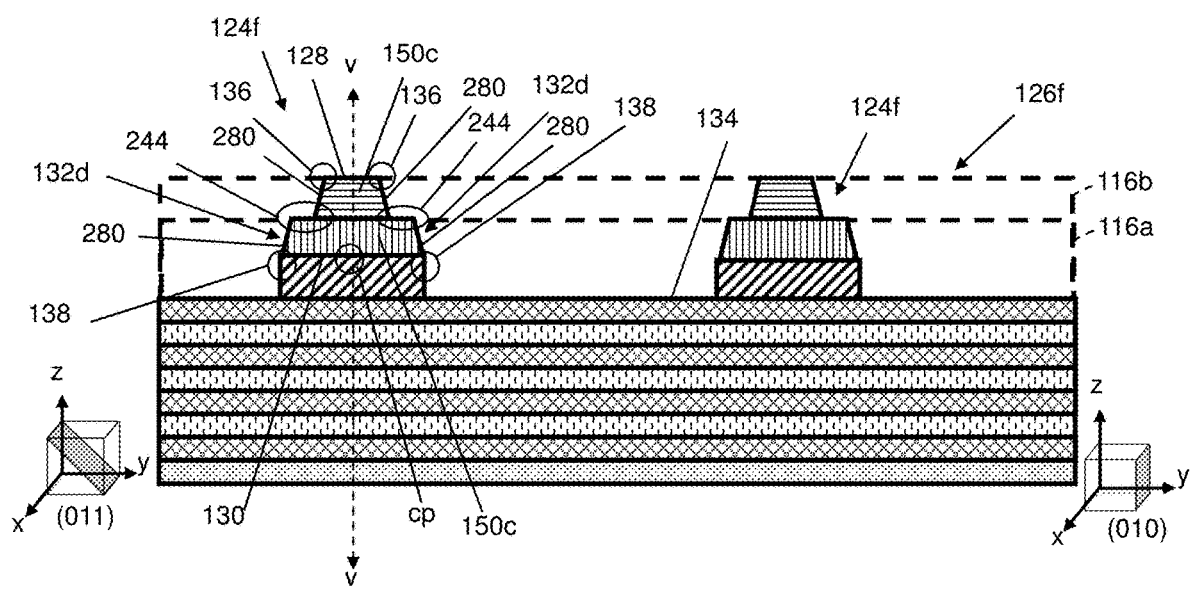
FIG. 14 show another example of forming absorber structures for an EUV mask from the initial structure of FIG. 10, according to embodiments of the disclosure.

Turning next to FIG. 14, another example of forming absorber structures for EUV mask 126f from the multiple absorber layers of initial structure 200 (FIG. 10) is shown, according to embodiments of the disclosure. In contrast to the example of FIGS. 11-13, absorber structures 124f of FIG. 14 may be formed by selecting materials for absorber layers 116a, 116b having different etch selectivity in the (010) crystalline direction. For example, in the example of FIG. 14, second absorber layer 116b may include a material (e.g., Nickel, or Nickel Silicide) having a higher etch selectivity in the (010) crystalline direction than the material (e.g., TaBN) of first absorber layer 116a. The etching rate of second absorber layer 116b may therefore be faster in the (010) crystalline direction and a greater amount of second absorber layer 116b removed during the etching process than first absorber layer 116b. As shown in FIG. 14, etching absorber layers 116a and 116b having different etch selectivities in the (010) crystalline direction may form absorber structures 124f having top portions 150c and bottom portions 160c, where top portions 150c are positioned on only a portion of the top surface of bottom portions 160c. For example, absorber structures 124f may include a step 166c. Additionally, absorber structures 124f may include sidewall portions 132f extending between top surfaces 128 and bottom surfaces 130 of the absorber structures. Absorber structures 124f may include outer edges 136 of the top surface that are positioned laterally closer to vertical axis 'v,' passing through substantially central point 'cp' of bottom surfaces 130 of the absorber structure, than outer edges 138 of the lower surface of the absorber structures. Similarly to absorber structures 124a-e (FIGS. 2-13), absorber structures 124f may therefore similarly prevent and/or mitigate the shadowing effect caused by conventional absorber structures of EUV mask.

As shown in the examples of FIG. 14, the etch process may include a single anisotropic etch in the (011) crystalline direction of absorber layers 116a, 116b that etches both of the absorber layers. For example, top portions 150c and bottom portions 160c of absorber structures 124f may include substantially straight and slanted sidewalls 280. Although sidewalls 280 are shown as substantially straight and slanted, the etching process used to form absorber structures 124f may be changed to allow for sidewalls 280 to include varying shapes. In another non-limiting example not shown, the etching process may include an isotropic etch such that sidewalls 280 may include concave sidewalls. Although performing a single etch process on both absorber layers 116a,116b is shown in FIG. 14, it is understood that the etching process may alternatively include multiple etch process that are selective to both of the absorber layers. In a non-limiting example not shown, the etching may include a first anisometric etch primarily in the (001) crystalline direction of both absorber layers followed by an anisometric etch primarily in the (010) crystalline direction of both absorber layers. For example, etching the absorber layers using a two-step etch may allow for sidewalls 280 to be substantially vertical.

As also shown in FIG. 14, similar to absorber structures 132e,d of FIGS. 9 and 13, respectively, sidewall portions 132f of absorber structures 124f may include step 166c. For example, absorber structures 124f may include step 166c between outer edges 136 of the top surface and outer edges 138 of the lower surface. For example, step 166c may be formed between top surface 128 and bottom surface 130 at the interface between top portion 150c and bottom portion 160c of each absorber structure. Although sidewall portions 132f are shown in FIG. 13 to include one step 166c, it is understood that sidewall portions 132f of absorber structures 124f may be formed to include any desirable number of steps. For example, additional steps may be formed by including additional absorber layers of different etch selectivity in the (010) crystalline direction. Additionally, although shown in FIG. 14 to include top portions 150c as having substantially the same central vertical axis v-v as bottom portions 160c, it should be understood that absorber structures 124f may be formed such that top portions 150c and bottom portions 160c include distinct central vertical axis.

EUV masks 126a-f of FIGS. 1-14 may be subject to further processing after forming absorber structures 124a-f as described above. For example, mask 118 (FIGS. 1 and 10) may be removed after forming absorber structures 124a-f. Mask 118 (FIGS. 1 and 10) may be removed by conventional semiconductor fabrication techniques for removing a mask such as, for example, etching. Further, portions of capping layer 114 adjacent to absorber structures 124a-f may be removed, for example, to re-expose top surface 134 of ML reflector 106. Portion of capping layer 114 may be removed by conventional semiconductor fabrication techniques for forming a mas such as, for example, etching using a mask (not shown). Additionally, although not shown in the examples of FIGS. 1-14, an anti-reflective coat (ARC) may be formed on a top surface absorber structures 124a-f after removing mask 118 (FIGS. 1 and 10). ARC (not shown) may, for example, allow for improved absorption of UV light by the absorber structures during use of EUV masks. ARC may be formed by deposition and/or any other now known or later developed semiconductor fabrication process for forming an ARC. ARC may include conventional ARC materials, such as non-limiting examples of compound materials including TaBO, $Cr_2O_3$, ITO, $SiO_2$, SiN, $TaO_5$, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/− 10% of the stated value(s). As used herein, the term "substantially trapezoidal" may refer to a shape having four major sides with two of the major sides being parallel to one another, but with some variation in the shape of the segments and/or the number of minor sides. As used herein, the term "substantially triangular" may refer to a shape having three major sides but with some variation in the shape of the segments and/or the number of minor line segments. As used herein, the term "substantially vertical" may include an angle of 90 degrees+/−10% with respect to the surface of reference. As used herein, the term "substantially slanted" may include an angle greater or less than the 90 degrees+/−10%.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An extreme ultraviolet (EUV) mask comprising:
a multi-layer (ML) reflector positioned on a substrate;
a capping layer on a top surface of the ML reflector, wherein the capping layer includes vertical sidewalls and is formed of a reflective material; and
an absorber structure positioned on a top surface of the capping layer, the absorber structure including:
a bottom surface contacting a top surface of the capping layer,
a top surface of the absorber structure opposite the bottom surface, an intermediate surface having a horizontal orientation and positioned between the top surface and the bottom surface of the absorber structure,
a first inwardly concave sidewall of the absorber structure extending between the bottom surface and the intermediate surface of the absorber structure, and
a second inwardly concave sidewall of the absorber structure extending between the intermediate surface of the absorber structure and the top surface of the absorber structure,
wherein an outer edge of the top surface of the absorber structure is closer to a vertical axis passing through a central point of the bottom surface of the absorber structure than to an outer edge of the bottom surface of the absorber structure.

2. An extreme ultraviolet (EUV) mask comprising:
a multi-layer (ML) reflector positioned on a substrate;
a capping layer on a top surface of the ML reflector, wherein the capping layer includes vertical sidewalls and is formed of a reflective material; and
an absorber structure positioned on a top surface of the capping layer, the absorber structure including:
a first absorber layer having a bottom surface contacting a top surface of the capping layer, and a top surface of the first absorber layer opposite the bottom surface, wherein the first absorber layer includes non-vertical sidewalls extending from the bottom surface of the first absorber layer to the top surface of the first absorber layer, and
wherein an outer edge of the top surface of the first absorber layer is closer to a vertical axis passing through a central point of the bottom surface of the first absorber layer than to an outer edge of the bottom surface of the first absorber layer, and
a second absorber layer having a bottom surface contacting the top surface of the first absorber layer, and a top surface of the second absorber layer opposite the bottom surface, wherein the second absorber layer includes non-vertical sidewalls extending from the bottom surface of the second absorber layer to the top surface of the second absorber layer, and wherein an outer edge of the top surface of the second absorber layer is closer to the vertical axis than to an outer edge of the bottom surface of the second absorber layer.

3. The EUV mask of claim 2, wherein a material composition of the first absorber layer is different from a material composition of the second absorber layer.

4. The EUV mask of claim 2, wherein the sidewalls of the first absorber layer and the second absorber layer are inwardly concave.

5. The EUV mask of claim 2, wherein the sidewalls of the first absorber layer and the second absorber layer each comprise a single slanted sidewall.

6. The EUV mask of claim 2, wherein a vertical cross-section of the first absorber layer or the second absorber layer is one of a substantially trapezoidal cross-section or a substantially triangular cross-section.

7. The EUV mask of claim 2, wherein an angular displacement of the sidewall of the first absorber layer or the second absorber layer from a top surface of the ML reflector is approximately 93 degrees to approximately 110 degrees.

8. The EUV mask of claim 2, wherein the top surface of the first absorber layer extends horizontally between the non-vertical sidewalls of the first absorber layer and the non-vertical sidewalls of the second absorber layer.

9. The EUV mask of claim 2, wherein the non-vertical sidewalls of the first absorber layer and the second absorber layer are each free of vertically-oriented sidewall portions.

* * * * *